(12) United States Patent
Geng et al.

(10) Patent No.: US 12,301,192 B2
(45) Date of Patent: May 13, 2025

(54) DIGITAL VARIABLE GAIN ADJUSTMENT ON BASEBAND CHIP

(71) Applicant: GREATER SHINE LIMITED, New Taipei (TW)

(72) Inventors: Jifeng Geng, San Diego, CA (US); Hong Kui Yang, San Diego, CA (US)

(73) Assignee: GREATER SHINE LIMITED, New Taipei (TW)

( * ) Notice: Subject to any disclaimer, the term of this patent is extended or adjusted under 35 U.S.C. 154(b) by 392 days.

(21) Appl. No.: 17/894,393

(22) Filed: Aug. 24, 2022

(65) Prior Publication Data

US 2022/0407485 A1    Dec. 22, 2022

Related U.S. Application Data

(63) Continuation of application No. PCT/US2021/020956, filed on Mar. 4, 2021.
(Continued)

(51) Int. Cl.
| | | |
|---|---|---|
| *H04B 7/14* | (2006.01) | |
| *H03G 3/30* | (2006.01) | |
| *H03M 7/24* | (2006.01) | |

(52) U.S. Cl.
CPC ......... *H03G 3/3078* (2013.01); *H03G 3/3089* (2013.01); *H03M 7/24* (2013.01)

(58) Field of Classification Search
CPC ..... H03G 3/3078; H03G 3/3089; H03M 7/24; H04L 25/0202; H04W 52/52;
(Continued)

(56) References Cited

U.S. PATENT DOCUMENTS 7,970,066 B1     6/2011  Lee et al.
8,582,692 B1 *  11/2013  Zhao ................... H04L 27/2647
                                                              375/319
(Continued)

FOREIGN PATENT DOCUMENTS

CN          1522500 A       8/2004
CN          1653835 A       8/2005
(Continued)

OTHER PUBLICATIONS

Qijin Zhang et al., "A Low Memory Design for Hybrid-ARQ Systems", Published in: 2008 4th International Conference on Wireless Communications, Networking and Mobile Computing, Date of Conference: Oct. 12-14, 2008.
(Continued)

*Primary Examiner* — Andrew Wendell
(74) *Attorney, Agent, or Firm* — BAYES PLLC

(57) ABSTRACT

Embodiments of apparatus and method for digital variable gain adjustment (DVGA) are disclosed. In an example, a baseband chip includes an unpacking module, a symbol recording module operatively coupled to the unpacking module, and a first variable gain adjusting (VGA) module operatively coupled to the symbol recording module. The unpacking module is configured to unpack a plurality of symbols from a first representation of pseudo floating-point numbers to a second representation of fixed-point numbers. The symbol recording module is configured to obtain a symbol parameter based on the unpacking. The first VGA module is configured to dynamically adjust gains of the plurality of symbols having the second representation based on the symbol parameter.

18 Claims, 9 Drawing Sheets

Related U.S. Application Data

(60) Provisional application No. 62/990,881, filed on Mar. 17, 2020.

(58) Field of Classification Search
CPC ........... H04W 52/00; H04B 2001/0416; H04B 7/15535; H04B 7/15578; H04B 10/2942; H04B 10/6931
See application file for complete search history.

(56) References Cited

U.S. PATENT DOCUMENTS

| | | | |
|---|---|---|---|
| 9,059,779 B2* | 6/2015 | Li | .............. H04B 1/40 |
| 9,369,235 B2* | 6/2016 | Hoffmann | ............. H04L 1/0007 |
| 11,018,656 B1* | 5/2021 | Sun | .................. H04L 25/03057 |
| 12,003,350 B1* | 6/2024 | McCormick | ...... H04W 72/0453 |
| 2003/0153289 A1 | 8/2003 | Hughes et al. | |
| 2004/0161046 A1 | 8/2004 | Schott et al. | |
| 2008/0013654 A1 | 1/2008 | Rick et al. | |
| 2010/0118917 A1* | 5/2010 | Oh | ..................... H04B 1/71637 |
| | | | 375/E1.001 |
| 2010/0246700 A1* | 9/2010 | Moriai | ................ H04L 27/2614 |
| | | | 375/295 |
| 2013/0183912 A1* | 7/2013 | Hoang | ..................... H04B 1/38 |
| | | | 455/79 |
| 2013/0309988 A1 | 11/2013 | Ji et al. | |
| 2014/0161210 A1 | 6/2014 | Chen et al. | |
| 2015/0071386 A1* | 3/2015 | Taniguchi | ............. H03G 3/3068 |
| | | | 375/340 |
| 2015/0249508 A1* | 9/2015 | Khasnis | ............... H04B 14/046 |
| | | | 375/243 |
| 2016/0142321 A1 | 5/2016 | Gage | |
| 2019/0238163 A1 | 8/2019 | Talwar et al. | |

FOREIGN PATENT DOCUMENTS

| | | |
|---|---|---|
| CN | 101964774 A | 2/2011 |
| CN | 107006045 A | 8/2017 |
| JP | S5630322 A | 3/1981 |
| JP | H08317012 A | 11/1996 |
| KR | 20080050985 A | 6/2008 |
| WO | 2008009007 A2 | 1/2008 |
| WO | 2020130896 A1 | 6/2020 |

OTHER PUBLICATIONS

V. Elvira et al., "Baseband Processor for RF-MIMO WLAN", Published in: 2010 17th IEEE International Conference on Electronics, Circuits and Systems, Date of Conference: Dec. 12-15, 2010.

Xiang Shunran, "FSK Model Establishment and Simulation of Trunking Communication Baseband Chip", Publisher: Electronics Technology, Release Date: May 22, 2015.

Gu Qian, "Research and Implementation of OFDM Based Wireless Communication Baseband System", Publisher: China Master's Theses Full-text Database, Release Date: Apr. 15, 2018.

Notice of Allowance issued in corresponding Chinese application No. 202180021412.1, mailed May 17, 2023.

International Search Report issued in International application No. PCT/US2021/020956, mailed Jun. 2, 2021.

Written Opinion of the International Searching Authority issued in International application No. PCT/US2021/020956, mailed Jun. 2, 2021.

* cited by examiner

DIGITAL VARIABLE GAIN ADJUSTMENT ON BASEBAND CHIP

CROSS-REFERENCE TO RELATED APPLICATIONS

This application is a continuation of International Application No. PCT/US2021/020956 filed on Mar. 4, 2021, entitled "DIGITAL VARIABLE GAIN ADJUSTMENT ON BASEBAND CHIP", which claims the benefit of priority to U.S. Provisional Application No. 62/990,881 filed on Mar. 17, 2020, entitled "ACCURATE AND FLEXIBLE RX DVGA ON BASEBAND CHIP," both of which are hereby incorporated by reference in their entireties.

BACKGROUND

Embodiments of the present disclosure relate to apparatus and method for wireless communication.

Wireless communication systems are widely deployed to provide various telecommunication services such as telephony, video, data, messaging, and broadcasts. In a wireless communication system, a receiver may receive signals from different transmitters at different received power levels and thus, may need to perform automatic gain control (AGC) to maintain the baseband signal level within an acceptable range in an attempt to avoid saturation of receiver circuits and clipping of an analog-to-digital converter (ADC) used to digitize the baseband signal.

SUMMARY

Embodiments of apparatus and method for digital variable gain adjustment (DVGA) are disclosed herein.

In one example, a baseband chip includes an unpacking module, a symbol recording module operatively coupled to the unpacking module, and a first variable gain adjusting (VGA) module operatively coupled to the symbol recording module. The unpacking module is configured to unpack a plurality of symbols from a first representation of pseudo floating-point numbers to a second representation of fixed-point numbers. The symbol recording module is configured to obtain a symbol parameter based on the unpacking. The first VGA module is configured to dynamically adjust gains of the plurality of symbols having the second representation based on the symbol parameter.

In another example, an apparatus for wireless communication includes a radio frequency (RF) chip and a baseband chip. The RF chip includes an RF front-end, and a packing module operatively coupled to the RF front-end and configured to pack a plurality of symbols into a first representation of pseudo floating-point numbers. The baseband chip includes an unpacking module, a symbol recording module operatively coupled to the unpacking module, and a VGA module operatively coupled to the symbol recording module. The unpacking module is configured to unpack the plurality of symbols from the first representation to a second representation of fixed-point numbers. The symbol recording module is configured to obtain a symbol parameter based on the unpacking. The VGA module is configured to dynamically adjust gains of the plurality of symbols having the second representation based on the symbol parameter.

In still another example, a method implemented by a baseband chip for wireless communication is disclosed. A plurality of symbols are unpacked from a first representation of pseudo floating-point numbers to a second representation of fixed-point numbers. A symbol parameter is obtained based on the unpacking. Gains of the plurality of symbols having the second representation are dynamically adjusted based on the symbol parameter.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
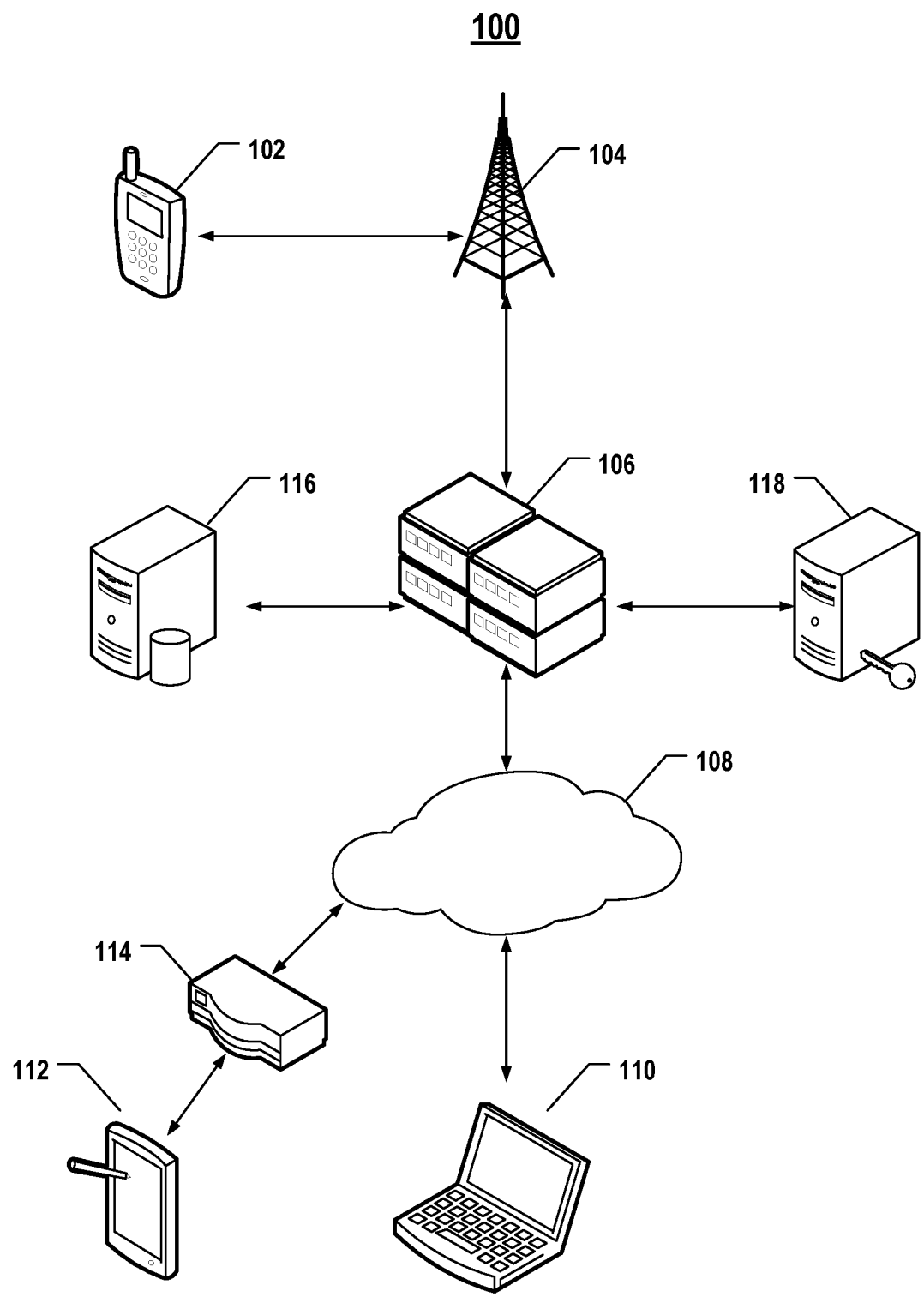
FIG. 1 illustrates an exemplary wireless network, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," "certain embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure, or characteristic is described in connection with an embodiment, it would be within the knowledge of a person skilled in the pertinent art to effect such feature, structure, or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Various aspects of wireless communication systems will now be described with reference to various apparatus and methods. These apparatus and methods will be described in the following detailed description and illustrated in the accompanying drawings by various blocks, modules, units, components, circuits, steps, operations, processes, algorithms, etc. (collectively referred to as "elements"). These elements may be implemented using electronic hardware, firmware, computer software, or any combination thereof. Whether such elements are implemented as hardware, firmware, or software depends upon the particular application and design constraints imposed on the overall system.

The techniques described herein may be used for various wireless communication networks, such as code division multiple access (CDMA) system, time division multiple access (TDMA) system, frequency division multiple access (FDMA) system, orthogonal frequency division multiple access (OFDMA) system, single-carrier frequency division multiple access (SC-FDMA) system, and other networks. The terms "network" and "system" are often used interchangeably. A CDMA network may implement a radio access technology (RAT), such as Universal Terrestrial Radio Access (UTRA), evolved UTRA (E-UTRA), CDMA 2000, etc. A TDMA network may implement a RAT, such as the Global System for Mobile Communications (GSM). An OFDMA network may implement a RAT, such as Long-Term Evolution (LTE) or New Radio (NR). The techniques described herein may be used for the wireless networks and RATs mentioned above, as well as other wireless networks and RATs.

RF chips often employ complicated receiver digital automatic gain control (DAGC) to reduce the dynamic range of symbols to be transmitted across the digital interface between the RF chips and baseband chips. The DAGC on an RF chip can only perform a coarse control of the gains of the signals, and the DAGC gains also need to be transmitted from the RF chip to the baseband chip. Moreover, any miscalculation of the DAGC may either saturate the signal or reserve too many headroom bits, thereby reducing the quality of the signals.

Various embodiments in accordance with the present disclosure provide an improved solution for receiver AGC by implementing dynamic digital variable gain adjustment (DVGA) on the baseband chip based on a symbol parameter, such as being indicative of the largest signal level (e.g., amplitude or power) among a block of symbols, obtained from the symbol unpacking process performed by the baseband chip. In some embodiments, the RF chip packs symbols from fixed-point numbers to pseudo floating-point numbers to reduce the throughput across the digital interface between the RF chip and the baseband chip as well as maintain the dynamic range of the symbols. The baseband chips can unpack the symbols and record a symbol parameter, for example, indicative of the largest symbol in the fixed-point number form or in the pseudo floating-point form, for every block of symbols. In view of each downstream subsystem's specific requirement, e.g., symbol accuracy, a corresponding DVGA module can perform a dynamic digital variable gain adjustment based on the respective symbol parameter for each symbol block or each group of symbol blocks with improved accuracy and flexibility compared with the known system.

That is, each subsystem of the baseband chip, such as the channel estimator or the searcher, may control its own customized gain adjustment based on its specific need (e.g., accuracy requirement) and the symbol parameter. As a result, more accurate gain control can be achieved for each subsystem, and the DVGA gain of the RF chip no longer needs to be provided to the baseband chip. Even for the same subsystem, the gain adjustment may be dynamically optimized at the symbol block level as the symbol parameter changes between symbol blocks. Moreover, the recording of the symbol parameters can be performed along with the unpacking process, i.e., as a streamlined operation, which does not add an extra delay to the system process.

FIG. 1 illustrates an exemplary wireless network 100, in which certain aspects of the present disclosure may be implemented, according to some embodiments of the present disclosure. As shown in FIG. 1, wireless network 100 may include a network of nodes, such as a user equipment (UE) 102, an access node 104, and a core network element 106. User equipment 102 may be any terminal device, such as a mobile phone, a desktop computer, a laptop computer, a tablet, a vehicle computer, a gaming console, a printer, a positioning device, a wearable electronic device, a smart sensor, or any other device capable of receiving, processing, and transmitting information, such as any member of a vehicle to everything (V2X) network, a cluster network, a smart grid node, or an Internet-of-Things (IoT) node. It is understood that user equipment 102 is illustrated as a mobile phone simply by way of illustration and not by way of limitation.

Access node 104 may be a device that communicates with user equipment 102, such as a wireless access point, a base station (BS), a Node B, an enhanced Node B (eNodeB or eNB), a next-generation NodeB (gNodeB or gNB), a cluster master node, or the like. Access node 104 may have a wired connection to user equipment 102, a wireless connection to user equipment 102, or any combination thereof. Access node 104 may be connected to user equipment 102 by multiple connections, and user equipment 102 may be connected to other access nodes in addition to access node 104. Access node 104 may also be connected to other user equipments. It is understood that access node 104 is illustrated by a radio tower by way of illustration and not by way of limitation.

Core network element 106 may serve access node 104 and user equipment 102 to provide core network services. Examples of core network element 106 may include a home subscriber server (HSS), a mobility management entity (MME), a serving gateway (SGW), or a packet data network gateway (PGW). These are examples of core network elements of an evolved packet core (EPC) system, which is a core network for the LTE system. Other core network elements may be used in LTE and in other communication systems. In some embodiments, core network element 106 includes an access and mobility management function (AMF) device, a session management function (SMF) device, or a user plane function (UPF) device, of a core network for the NR system. It is understood that core network element 106 is shown as a set of rack-mounted servers by way of illustration and not by way of limitation.

Core network element 106 may connect with a large network, such as the Internet 108, or another Internet Protocol (IP) network, to communicate packet data over any distance. In this way, data from user equipment 102 may be communicated to other user equipments connected to other access points, including, for example, a computer 110 connected to Internet 108, for example, using a wired connection or a wireless connection, or to a tablet 112 wirelessly connected to Internet 108 via a router 114. Thus, computer 110 and tablet 112 provide additional examples of possible user equipments, and router 114 provides an example of another possible access node.

A generic example of a rack-mounted server is provided as an illustration of core network element 106. However, there may be multiple elements in the core network including database servers, such as a database 116, and security and authentication servers, such as an authentication server 118. Database 116 may, for example, manage data related to user subscription to network services. A home location register (HLR) is an example of a standardized database of subscriber information for a cellular network. Likewise, authentication server 118 may handle authentication of users, sessions, and so on. In the NR system, an authentication server function (AUSF) device may be the specific entity to perform user equipment authentication. In some embodiments, a single server rack may handle multiple such functions, such that the connections between core network element 106, authentication server 118, and database 116, may be local connections within a single rack.

Figure 10:
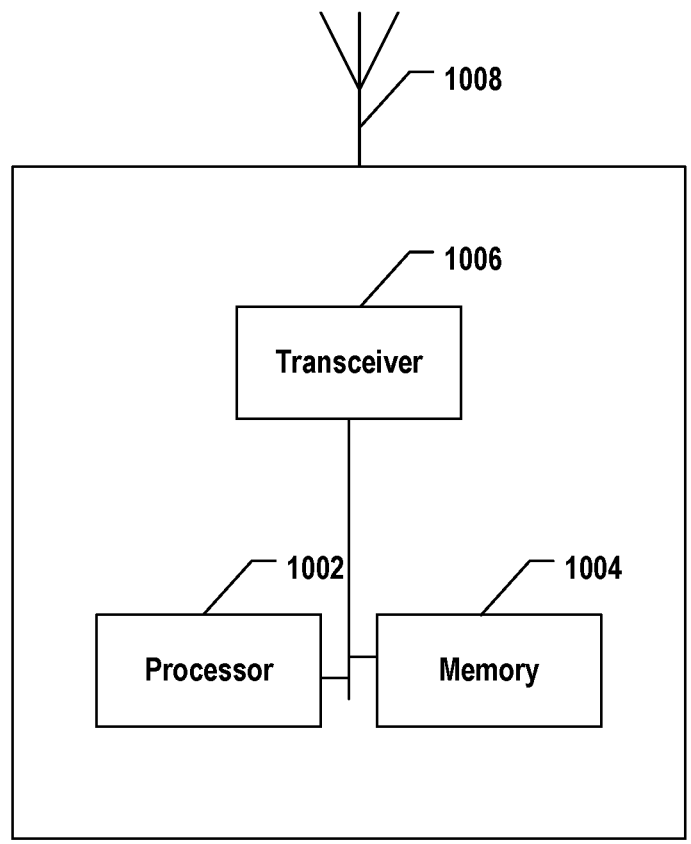
FIG. 10 illustrates a block diagram of an exemplary node, according to some embodiments of the present disclosure.

Each element in FIG. 1 may be considered a node of wireless network 100. More detail regarding the possible implementation of a node is provided by way of example in the description of a node 1000 in FIG. 10. Node 1000 may be configured as user equipment 102, access node 104, or core network element 106 in FIG. 1. Similarly, node 1000 may also be configured as computer 110, router 114, tablet 112, database 116, or authentication server 118 in FIG. 1. As shown in FIG. 10, node 1000 may include a processor 1002, a memory 1004, and a transceiver 1006. These components are shown as connected to one another by a bus, but other connection types are also permitted. When node 1000 is user equipment 102, additional components may also be included, such as a user interface (UI), sensors, and the like. Similarly, node 1000 may be implemented as a blade in a server system when node 1000 is configured as core network element 106. Other implementations are also possible.

Transceiver 1006 may include any suitable device for sending and/or receiving data. Node 1000 may include one or more transceivers, although only one transceiver 1006 is shown for simplicity of illustration. An antenna 1008 is shown as a possible communication mechanism for node 1000. Multiple antennas and/or arrays of antennas may be utilized. Additionally, examples of node 1000 may communicate using wired techniques rather than (or in addition to) wireless techniques. For example, access node 104 may communicate wirelessly to user equipment 102 and may communicate by a wired connection (for example, by optical or coaxial cable) to core network element 106. Other communication hardware, such as a network interface card (NIC), may be included as well.

As shown in FIG. 10, node 1000 may include processor 1002. Although only one processor is shown, it is understood that multiple processors can be included. Processor 1002 may include microprocessors, microcontroller units (MCUs), digital signal processors (DSPs), application-specific integrated circuits (ASICs), field-programmable gate arrays (FPGAs), programmable logic devices (PLDs), state machines, gated logic, discrete hardware circuits, and other suitable hardware configured to perform the various functions described throughout the present disclosure. Processor 1002 may be a hardware device having one or more processing cores. Processor 1002 may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. Software can include computer instructions written in an interpreted language, a compiled language, or machine code. Other techniques for instructing hardware are also permitted under the broad category of software.

As shown in FIG. 10, node 1000 may also include memory 1004. Although only one memory is shown, it is understood that multiple memories can be included. Memory 1004 can broadly include both memory and storage. For example, memory 1004 may include random-access memory (RAM), read-only memory (ROM), static RAM (SRAM), dynamic RAM (DRAM), ferro-electric RAM (FRAM), electrically erasable programmable ROM (EEPROM), CD-ROM or other optical disk storage, hard disk drive (HDD), such as magnetic disk storage or other magnetic storage devices, Flash drive, solid-state drive (SSD), or any other medium that can be used to carry or store desired program code in the form of instructions that can be accessed and executed by processor 1002. Broadly, memory 1004 may be embodied by any computer-readable medium, such as a non-transitory computer-readable medium.

Processor 1002, memory 1004, and transceiver 1006 may be implemented in various forms in node 1000 for performing wireless communication functions. In some embodiments, processor 1002, memory 1004, and transceiver 1006 of node 1000 are implemented (e.g., integrated) on one or more system-on-chips (SoCs). In one example, processor 1002 and memory 1004 may be integrated on an application processor (AP) SoC (sometimes known as a "host," referred to herein as a "host chip") that handles application processing in an operating system environment, including generating raw data to be transmitted. In another example, processor 1002 and memory 1004 may be integrated on a baseband processor (BP) SoC (sometimes known as a "modem," referred to herein as a "baseband chip") that converts the raw data, e.g., from the host chip, to signals that can be used to modulate the carrier frequency for transmission, and vice versa, which can run a real-time operating system (RTOS). In still another example, processor 1002 and transceiver 1006 (and memory 1004 in some cases) may be integrated on an RF SoC (sometimes known as a "transceiver," referred to herein as an "RF chip") that transmits and receives RF signals with antenna 1008. It is understood that in some examples, some or all of the host chip, baseband chip, and RF chip may be integrated as a single SoC. For example, a baseband chip and an RF chip may be integrated into a single SoC that manages all the radio functions for cellular communication.

Referring back to FIG. 1, in some embodiments, any suitable node of wireless network 100 (e.g., user equipment 102 or access node 104) in transmitting signals to another node, for example, from access node 104 to user equipment 102 via a downlink (DL), may implement dynamic digital variable gain adjustment on the baseband chip based on the symbol parameter (e.g., indicative of the largest signal level of a symbol block), as described below in detail. As a result, compared with known solutions, the accuracy and flexibility of automatic gain control for the node can be improved without introducing additional interface throughput and process delay.

Figure 2:
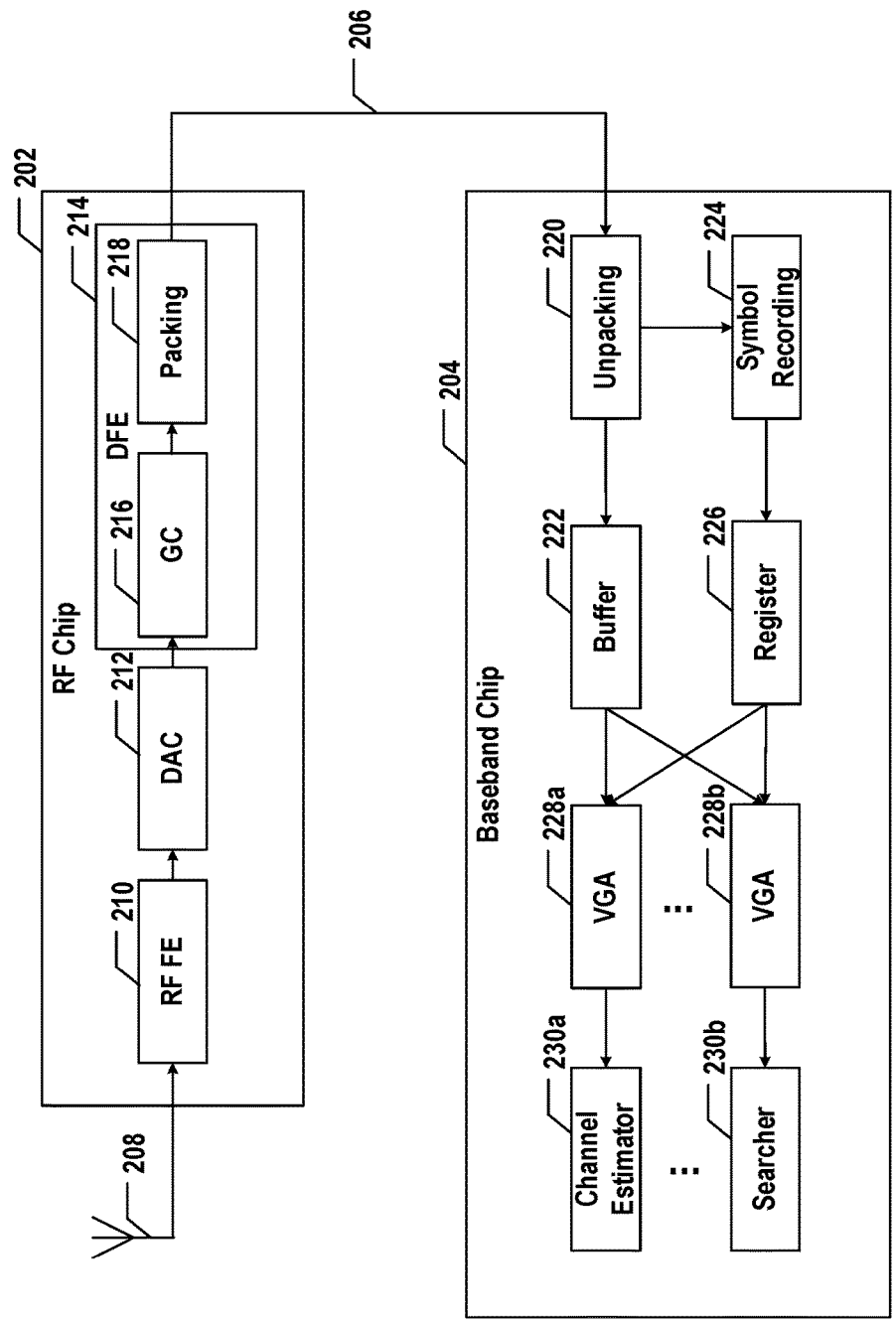
FIG. 2 illustrates a block diagram of an exemplary apparatus including an RF chip and a baseband chip implementing DVGA, according to some embodiments of the present disclosure.

FIG. 2 illustrates a block diagram of an exemplary apparatus 200 including an RF chip 202 and a baseband chip 204 implementing DVGA, according to some embodiments of the present disclosure. Apparatus 200 may be an example of any suitable node of wireless network 100, such as user equipment 102. As shown in FIG. 2, apparatus 200 may include RF chip 202, baseband chip 204, a digital interface 206 between RF chip 202 and baseband chip 204, and an antenna 208. In some embodiments, baseband chip 204 is implemented by processor 1002 and memory 1004, and RF chip 202 is implemented by processor 1002, memory 1004, and transceiver 1006, as described above with respect to FIG. 10. It is understood that besides the various modules of baseband chip 204 and RF chip 202 in the downlink shown in FIG. 2, any other suitable modules, such as modules in the uplink, may be included in baseband chip 204 and RF chip 202 as well. It is also understood that baseband chip 204 and RF chip 202 may be either two discrete chips or integrated into a single SoC (i.e., each considering a subsystem of a wireless chip).

As shown in FIG. 2, RF chip 202 may include an RF front-end (FE) 210, a digital-to-analog converter (DAC) 212, a digital front-end (DFE) 214 in the downlink. RF front-end 210 (also known as "analog front-end") may include any elements between antenna 208 and digital-to-analog converter 212, which handles analog signals. RF front-end 210 may include, for example, RF filters, RF amplifiers, local oscillators, and mixers. Digital-to-analog converter 212 may be configured to convert a stream of symbols (a.k.a. samples, e.g., OFDM symbols) in an analog form (e.g., radio signals) to a digital form (e.g., digital signals).

Digital front-end 214 may be implemented by processor 1002 shown in FIG. 10, such as one or more MCUs and/or DSPs, and/or dedicated hardware components, such as ASICs. Digital front-end 214 may include any elements that process the digital signals after digital-to-analog converter 212 that converts the analog signals into digital signals. In some embodiments, digital front-end 214 includes a gain control (GC) module 216 and a packing module 218. Additional elements may be included in digital front-end 214 to perform any other front-end functions on digital signals, such as filtering, up-conversion, or sample-rate conversion. Gain control module 216 may be configured to perform digital gain adjustment on a stream of symbols to reduce the dynamic range of the symbols to be transmitted across digital interface 206. Gain control module 216 may be configured to adjust the gain (e.g., the amplitude or power) of each symbol prior to packing module 218. For example, gain control module 216 may increase the signal level in case it is below a threshold value after passing the channel filter (not shown).

As a digital signal, each symbol may be represented in various number formats with different accuracies, such as fixed-point numbers, floating-point numbers, pseudo floating-point numbers, etc. In some embodiments, the symbols after gain control module 216 are in a representation of fixed-point numbers. That is, each symbol after gain control module 216 may be represented by a fixed-point number. A fixed-point number of a complex number may be represented as I+jQ, where I is the real part, Q is the imaginary part, and j is the imaginary unit. The signal level (e.g., amplitude or power) of a symbol may be determined by the values of I and Q. The accuracy of the fixed-point number may be determined by the number of bits m. For example, a 32-bit fixed-point number may include a 16-bit real part I and a 16-bit imaginary part Q. That is, a total of 2m bits of data may be used to represent a symbol using the representation of a 2m-bit fixed-point complex number.

Figure 3:
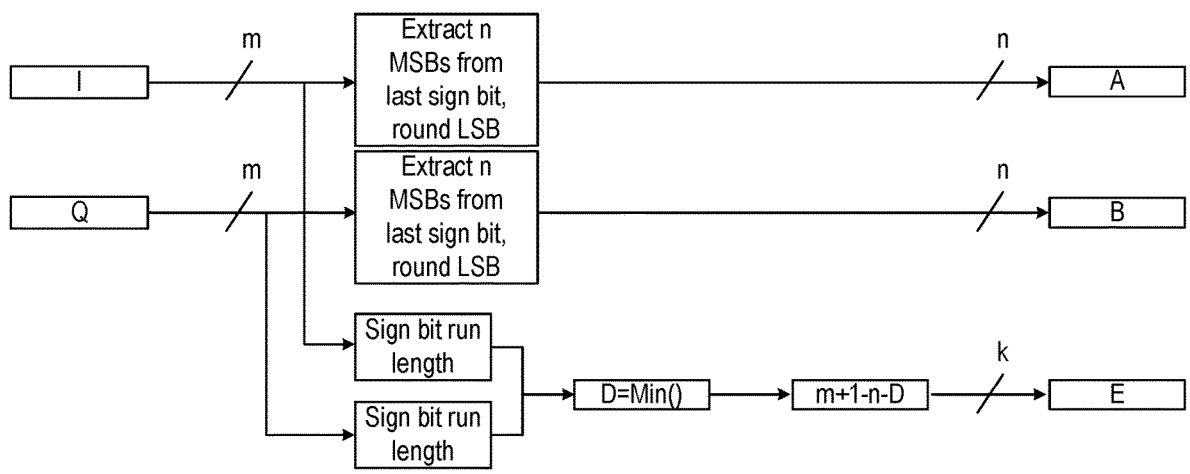
FIG. 3 illustrates an exemplary scheme of converting a fixed-point number to a pseudo floating-point number, according to some embodiments of the present disclosure.

In some embodiments, to reduce the throughput of the symbols across digital interface 206 while maintaining the dynamic range of the symbols, packing module 218 is configured to pack the stream of symbols in the representation of fixed-point numbers into another representation of pseudo floating-point numbers, for example with a smaller number of bits compared with the fixed-point numbers. A pseudo floating-point number of a complex number may be represented as $(A+jB)2^E$, where A and B are mantissas of the real part and the imaginary part, respectively, j is the imaginary unit, and E is the exponential number. The accuracy of the pseudo floating-point number may be determined by the numbers of bits n and k. For example, a 24-bit pseudo floating-point number may include a 10-bit real part mantissa A, a 10-bit imaginary part mantissa B, and a 4-bit exponential number E. That is, a total of 2n+k bits of data may be used to represent a symbol using the representation of a 2n+k-bit fixed-point complex number. For example, as shown in FIG. 3, the real part mantissa A having n bits of a pseudo floating-point number may be converted by extracting n most significant bits (MSBs) from the last sign bit of the real part number I having m bits of a fixed-point number and rounding the least significant bit (LSB). Similarly, the imaginary part mantissa B having n bits of the pseudo floating-point number may be converted by extracting n MSBs from the last sign bit of the imaginary part number Q having m bits of the fixed-point number and rounding the LSB. The exponential number E having k bits of the pseudo floating-point number may be converted based on m, n, and the minimum of the sign bit run lengths of I and Q, i.e., D. It is understood that FIG. 3 illustrates one example of the converting scheme that may be implemented by packing module 218, and any other suitable schemes for converting a fixed-point number to a pseudo floating-point number may be applied by packing module 218 in other examples as well.

Referring back to FIG. 2, a pseudo floating-point number can capture a larger dynamic range than a fixed-point number. By reducing the total number of bits used for representing each symbol (e.g., from 32-bit to 24 bit), the data throughput of the symbols can also be reduced, without sacrificing the dynamic range, by packing the symbols in the representation of fixed-point numbers into the representation of pseudo floating-point numbers by packing module 218 of RF chip 202. It is understood that in some examples, packing module 218 may pack the symbols from the fixed-point numbers into any other suitable representations.

As shown in FIG. 2, digital interface 206 may be any interface between RF chip 202 and baseband chip 204 that can transmit digital signals from the RF chip 202 to baseband chip 204 in the downlink. For example, digital interface 206 may be configured to transmit a stream of symbols in the representations of pseudo floating-point numbers. It is understood that in some examples, control signals may be transmitted from RF chip 202 and baseband chip 2-4 by digital interface 206 along with the data signals as well.

Figure 4:
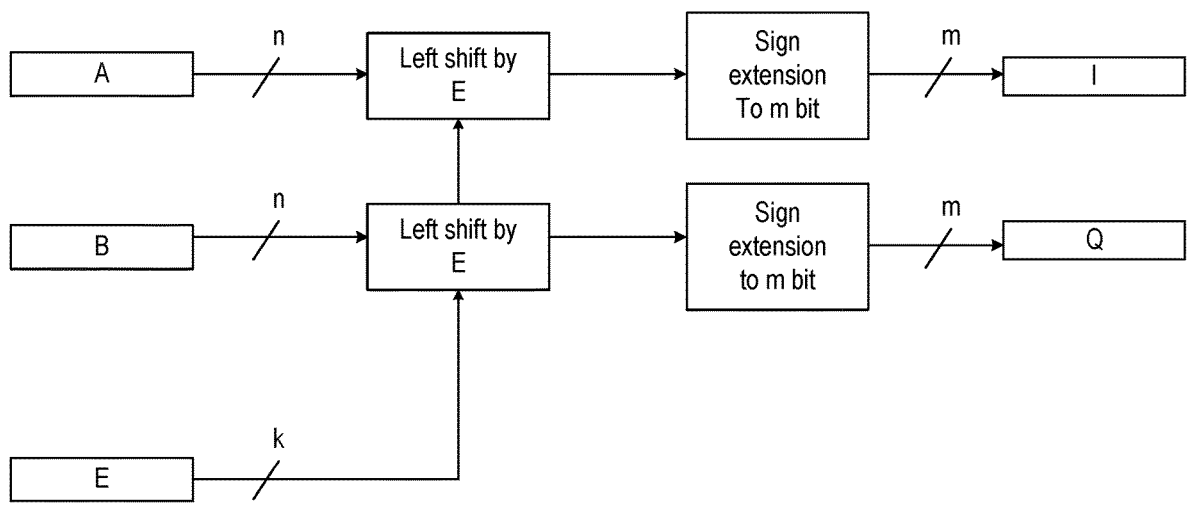
FIG. 4 illustrates an exemplary scheme of converting a pseudo floating-point number to a fixed-point number, according to some embodiments of the present disclosure.

As shown in FIG. 2, baseband chip 204 includes an unpacking module 220, a buffer 222, a symbol recording module 224, a set of registers 226, VGA modules 228, and subsystems 230 in the downlink, according to some embodiments. It is understood that additional components, for example, components used for uplink, may be included in baseband chip 204. Unpacking module 220 may be operatively coupled to digital interface 206 and configured to receive the stream of symbols in the representation of pseudo floating-point numbers from RF chip 202 and perform an unpacking process on the symbols. In some embodiments, unpacking module 220 is configured to unpack the symbols from the representation of pseudo floating-point numbers to the representation of fixed-point numbers. That is, unpacking module 220 may convert each symbol back to its fixed-point number representation once it is received by baseband chip 204. For example, as illustrated in FIG. 4, the real part number I having m bits of a fixed-point number may be converted by left shifting the real part mantissa A having n bits of the pseudo floating-point number by the exponential number E having k bits of the pseudo floating-point number, followed by sign extension to m bits. Similarly, the imaginary part number Q having m bits of the fixed-point number may be converted by left shifting the imaginary part mantissa B having n bits by the exponential number E, followed by sign extension to m bits. It is understood that FIG. 4 illustrates one example of the converting scheme that may be implemented by unpacking module 220, and any other suitable schemes for converting a pseudo floating-point number to a fixed-point number may be applied by unpacking module 220 in other examples as well. It is further understood that in some examples, unpacking module 220 may unpack the symbols into any other suitable representations.

Referring back to FIG. 2, the unpacking of a stream of symbols may be performed in a streamlined manner, and each unpacked symbol having the representation of a fixed-point number may be stored in buffer 222 (e.g., a dedicated data buffer or a shared data buffer on baseband chip 204). Besides the symbols themselves, various types of symbol parameters can be revealed from the unpacking process and utilized by downstream components, for example, VGA modules 228 and subsystems 230, to achieve variable gain adjustment with improved accuracy and flexibility, as described below in detail. As the symbol parameters are obtained from the unpacking process in a streamlined manner, the process may not introduce additional delay.

In some embodiments, symbol recording module 224 is operatively coupled to unpacking module 220 and configured to obtain a symbol parameter based on the unpacking. The symbol parameter may include any parameters associated with the unpacking process. In some embodiments, the symbol parameter is indicative of the largest signal level (e.g., amplitude or power) of the symbols. In one example, the symbol parameter includes the largest magnitude number of real parts and imaginary parts of the largest fixed-point number of the fixed-point numbers. That is, symbol recording module 224 may record the maximum magnitude number of all I and Q parts of the symbols (the largest I/Q magnitude number), i.e., max(max(abs(I(n)), max(abs(Q(n))), where n is the number of symbols. In another example, the symbol parameter includes the largest exponential number of the pseudo floating-point numbers. That is, symbol recording module 224 may record the maximum E number (Max(E)) of the symbols, i.e., Max(E)=max(E(n)). That is, the symbol parameter indicative of the largest signal level of the symbols may be obtained from either the input of unpacking module 220 (e.g., in pseudo floating-point numbers) or from the output of unpacking module 220 (e.g., in fixed-point numbers). In some embodiments, as the fixed-point numbers may be more accurate than the pseudo floating-point numbers, i.e., having more bits, the maximum magnitude number of all I and Q parts of the fixed-point numbers has higher accuracy but lower processing complexity than the maximum E number, in indicating the largest signal level. It is understood that in some examples, besides the maximum E number, the maximum A/B magnitude number, i.e., the largest magnitude number of all real part and imaginary part mantissas, of the symbols may be used as the symbol parameter for indicating the largest signal level as well.

In some embodiments, the symbol parameter recording is performed at a symbol block level such that the symbol parameter can be updated for each symbol block to achieve a finer-granularity control with higher accuracy and flexibility. For example, the stream of symbols may be divided into a plurality of blocks of symbols (symbol block), and symbol recording module 224 may be configured to obtain a respective symbol parameter for each symbol block. The number of symbols (N) in each symbol block may be the same, i.e., a preset value, or different, i.e., being dynamically updateable. In some embodiments, register 226 is configured to store the symbol parameters obtained by symbol recording module 224, as well as to store the number of symbols (N) in each symbol block.

Figure 5:
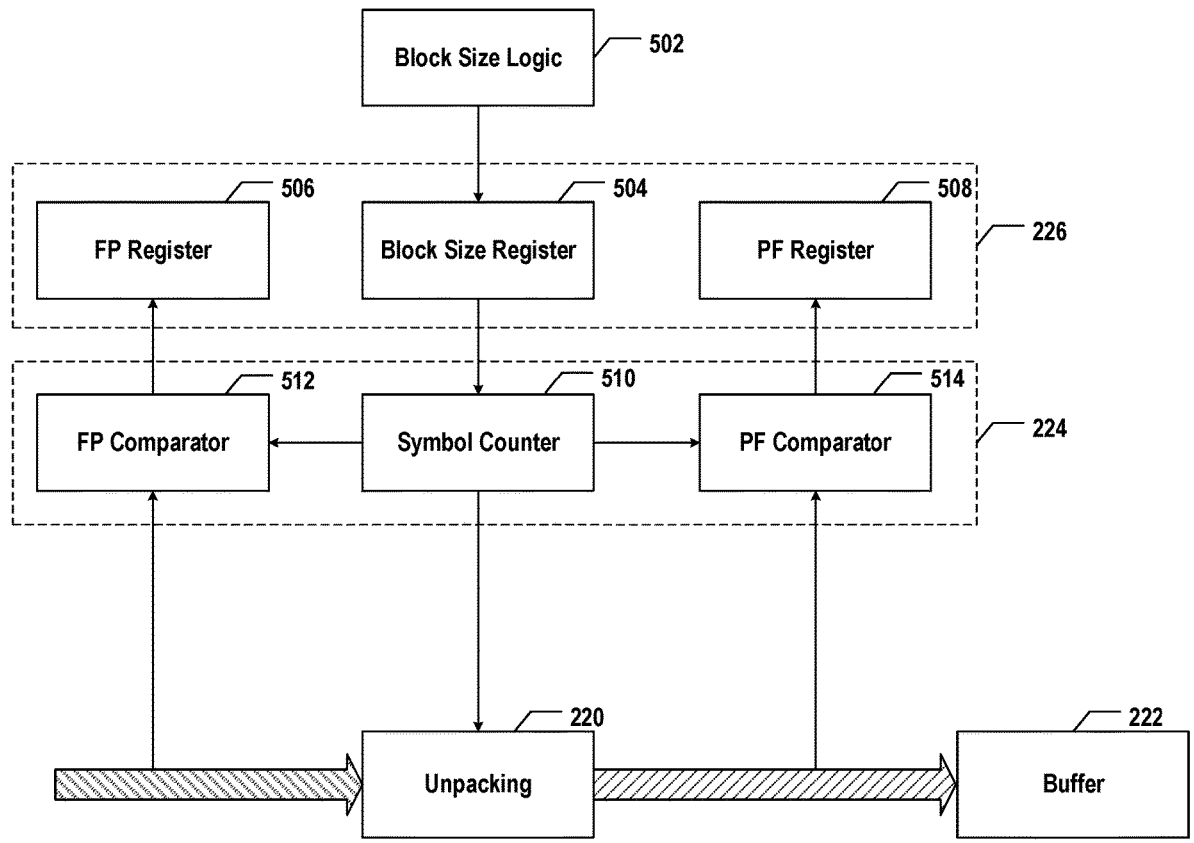
FIG. 5 illustrates a detailed block diagram of an exemplary baseband chip of the apparatus shown in FIG. 2, according to some embodiments of the present disclosure.

For example, as shown in FIG. 5, symbol recording module 224 includes a symbol counter 510, a fixed-point (FP) comparator 512, and a pseudo floating-point (PF) comparator 514, and registers 226 include a block size register 504, a fixed-point register 506, and a pseudo floating-point register 508. As shown in FIG. 5, baseband chip 204 may further include block size logic 502, e.g., implemented by processor 1002 in FIG. 10 or an ASIC. Block size logic 502 may be configured to determine the number of symbols of each symbol block based on a characteristic of the respective symbol block. That is, the block size N may be programmable and dynamically updated by block size logic 502. The characteristic may include the service of the symbol block (e.g., voice, file downloading, etc.) or the traffic pattern of the symbol block. For example, for symbol blocks with a low quality of service (QoS) requirement and/or steady traffic pattern, the number of symbols in the symbol block may be increased as the accuracy requirement and/or the dynamic range of the symbols may be reduced. The block size N may be stored into block size register 504 and retrieved by symbol counter 510 for counting the number of symbols in the stream of symbols passing through unpacking module 220.

In some embodiments, for each N symbols that undergo the unpacking process, symbol counter 510 is configured to inform fixed-point comparator 512 and/or pseudo floating-point comparator 514 to compare the signal levels of the N symbols and obtain the latest value, respectively. In some embodiments, for symbol block, fixed-point comparator 512 is configured to compare the fixed-point numbers representing the symbols in the symbol block and obtain the largest magnitude number of real parts and imaginary parts of the fixed-point number. The largest I/Q magnitude number may be stored into fixed-point register 506 by fixed-point comparator 512. In some embodiments, one or more symbol blocks are combined into a symbol block group, and the largest I/Q magnitude number of the symbol group may be determined by comparing the largest I/Q magnitude numbers of each symbol block. For example, as shown in FIG.

6A, a stream of symbols (S(1), S(2), S(2N+N')) may include three symbol blocks. Each symbol may be in the representation of a fixed-point number after unpacking. Each of the first and second symbol blocks may have the same number of N symbols, i.e., S(1) to S(N), and S(N+1) to S(2N). The number of symbols, i.e., block size, may change to N' in the third symbol block, i.e., S(2N+1) to S(2N+N'). For each of the symbol blocks, the largest I/Q magnitude number may be obtained, i.e., MAX (I, Q) 1, MAX (I, Q) 2, and MAX (I, Q) 3. In some examples, the first and second symbol blocks may be combined into a symbol block group, and the largest I/Q magnitude number of the symbol block group may be the larger one of MAX (I, Q) 1 and MAX (I, Q) 2.

Figure 6A:
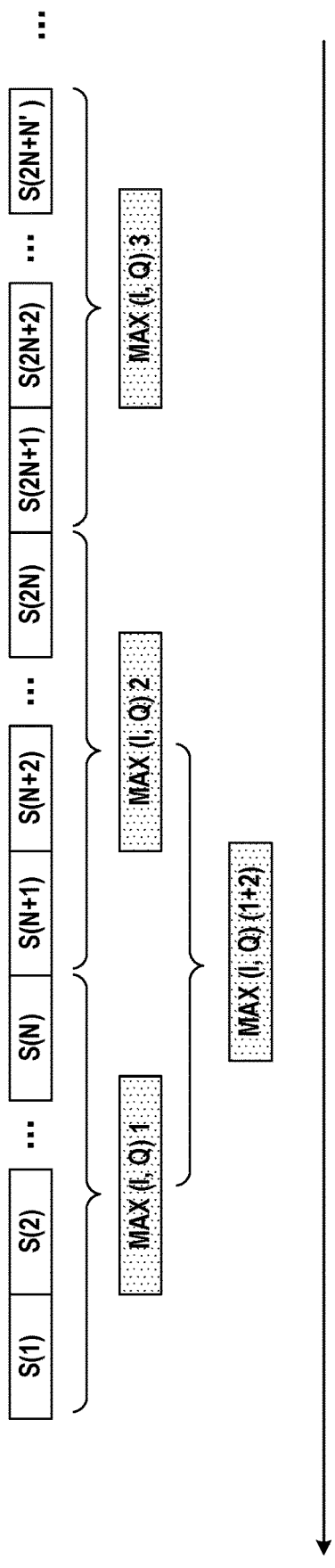
FIGS. 6A and 6B illustrate various exemplary schemes of obtaining symbol parameters of symbol blocks, according to various embodiments of the present disclosure.
Figure 6B:
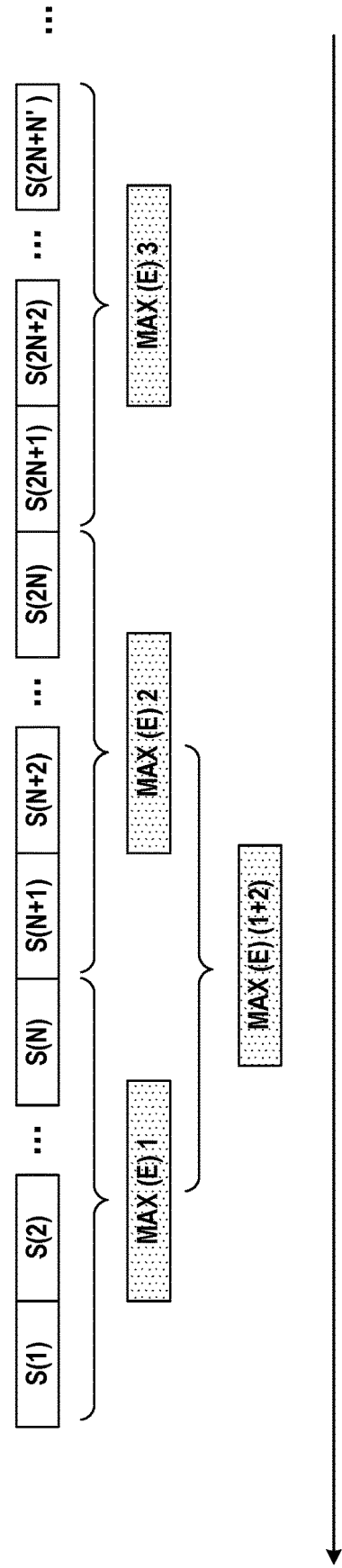

In some embodiments, for symbol block, pseudo floating-point comparator 514 is configured to compare the pseudo floating-point numbers representing the symbols in the symbol block and obtain the largest E number of the floating-point numbers (and the A/B numbers associated with the largest E number as needed). The largest E number (and associated A/B numbers as needed) may be stored into pseudo floating-point register 508 by pseudo floating-point comparator 514. In some embodiments, one or more symbol blocks are combined into a symbol block group, and the largest E number of the symbol group may be determined by comparing the largest E numbers of each symbol block. For example, as shown in FIG. 6B, a stream of symbols (S(1), S(2), S(2N+N')) may include three symbol blocks. Each symbol may be in the representation of a pseudo floating-point before unpacking. Each of the first and second symbol blocks may have the same number of N symbols, i.e., S(1) to S(N), and S(N+1) to S(2N). The number of symbols, i.e., block size, may change from N to N' in the third symbol block, i.e., S(2N+1) to S(2N+N'). For each of the symbol blocks, the largest E number of the symbols may be obtained, i.e., MAX (E) 1, MAX (E) 2, and MAX (E) 3. In some examples, the first and second symbol blocks may be combined into a symbol block group, and the largest E number of the symbol block group may be the larger one of MAX (E) 1 and MAX (E) 2.

Referring back to FIG. 2, each VGA module 228 may be configured to receive the stream of symbols (e.g., having symbol blocks) in the representation of fixed-point numbers from buffer 222, as well as to receive the symbol parameters (e.g., symbol parameters of symbol blocks, respectively) from register 226. As shown in FIG. 2, each VGA module 228 may be operatively coupled to a respective subsystem 230. In other words, each subsystem 230 may have its own, dedicated VGA module 228 that can customize the gain adjustment for the specific needs of respective subsystem 230. Subsystem 230 of baseband chip 204 referred to herein may include any downstream subsystem after VGA module 228 that receives symbols with adjusted gains controlled by VGA module 228. For example, subsystem 230 may include a channel estimator 230a operatively coupled to a first VGA module 228a and configured to estimate channel characteristics and perform cell search, and a searcher 230b operatively coupled to a second VGA module 228b and configured to determine symbol boundary, frequency error, etc. It is understood that although two subsystems 230a and 230b are shown in FIG. 2, additional subsystem 230 and its respective VGA module 228 may be included in baseband chip 204, such as a feedback manager. Each subsystem 230 may be associated with its quality requirements, such as symbol accuracy. In some embodiments, the symbol accuracy includes the bit number of an output of respective VGA module 228, i.e., the input of respective subsystem 230. For example, channel estimator 230a may have its symbol accuracy of 8-bits, which is smaller than the symbol accuracy of 12-bits of searcher 230b, or vice versa.

In some embodiments, VGA module 228 is configured to adjust the gains of the symbols based on the respective symbol accuracy and the symbol parameter. For example, each VGA module 228 may adjust the gains of each symbol block based on the symbol accuracy of respective subsystem 230 and the maximum signal level (e.g., the largest I/Q magnitude number or E number) of the respective symbol block. As described above, the symbol parameter may include additional parameters, such as the different number of symbols in different symbol blocks. That is, in some embodiments, the gain adjustment performed by each VGA module 228 may be dynamically updated at the symbol block level by updating the symbol parameter of each symbol block or symbol block group.

Figure 7A:
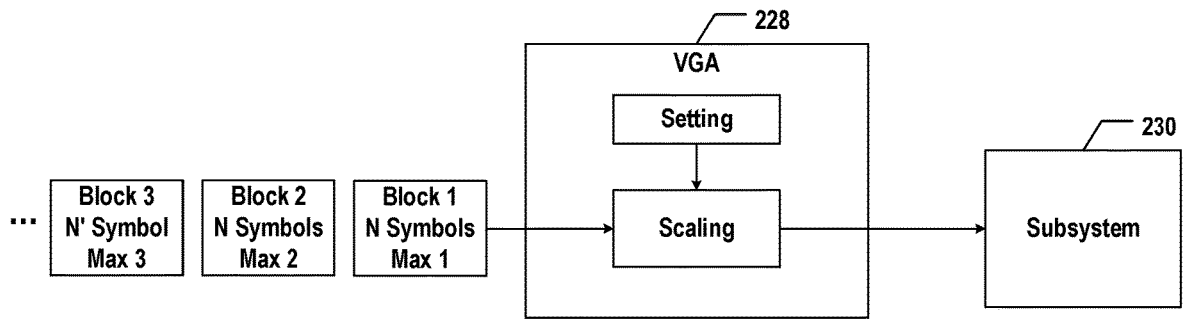
FIGS. 7A and 7B illustrate various exemplary DVGA implementations based on symbol parameters, according to various embodiments of the present disclosure.

As shown in FIG. 7A, VGA module 228 may be configured to scale the amplitude of each symbol based on the settings and the symbol parameter at the symbol block level. Each VGA module 228 may include one or more digital variable gain amplifiers. The setting may include the symbol accuracy of respective subsystem 230, for example, the output bit number of VGA module 228, e.g., 8-bits, 10-bits, 12-bits, etc. For example, the amplitude of the symbol having the largest signal level in each symbol block may be scaled such that the bit number of its I/Q magnitude numbers (the largest I/Q magnitude number in the symbol block) matches the output bit number of VGA module 228, and the amplitudes of the rest symbols in the same symbol group may be scaled up or scaled down accordingly. As shown in FIG. 7A, the symbol parameter may change from symbol block to symbol block, e.g., with different block sizes (N and N') and different maximum signal levels (Max 1, Max 2, and Max 3), such that the gain adjustment may be dynamically changed from symbol block to symbol block (or symbol block groups).

Besides dynamically adjusting the gains at the symbol block level for the same VGA module 228, different VGA modules 228 may customize its gain adjustment based on its own setting, for example, related to the specific needs/requirements of respective subsystem 230. For example, first VGA module 228a may adjust the gains of each symbol block based on the first symbol accuracy of channel estimator 230a the maximum signal level (e.g., the largest I/Q magnitude number or E number) of the respective symbol block; whereas second VGA module 228b may adjust the gains of each symbol block based on the second symbol accuracy of searcher 230b and the maximum signal level (e.g., the largest I/Q magnitude number or E number) of the respective symbol block. As described above, the symbol parameter may include additional parameters, such as the number of symbols in each symbol block and the number of symbol blocks. Thus, in some embodiments, the gain adjustment performed by different VGA modules 228 may be based on different numbers of symbols and/or different numbers of symbol blocks in addition to different maximum signal levels.

Figure 7B:
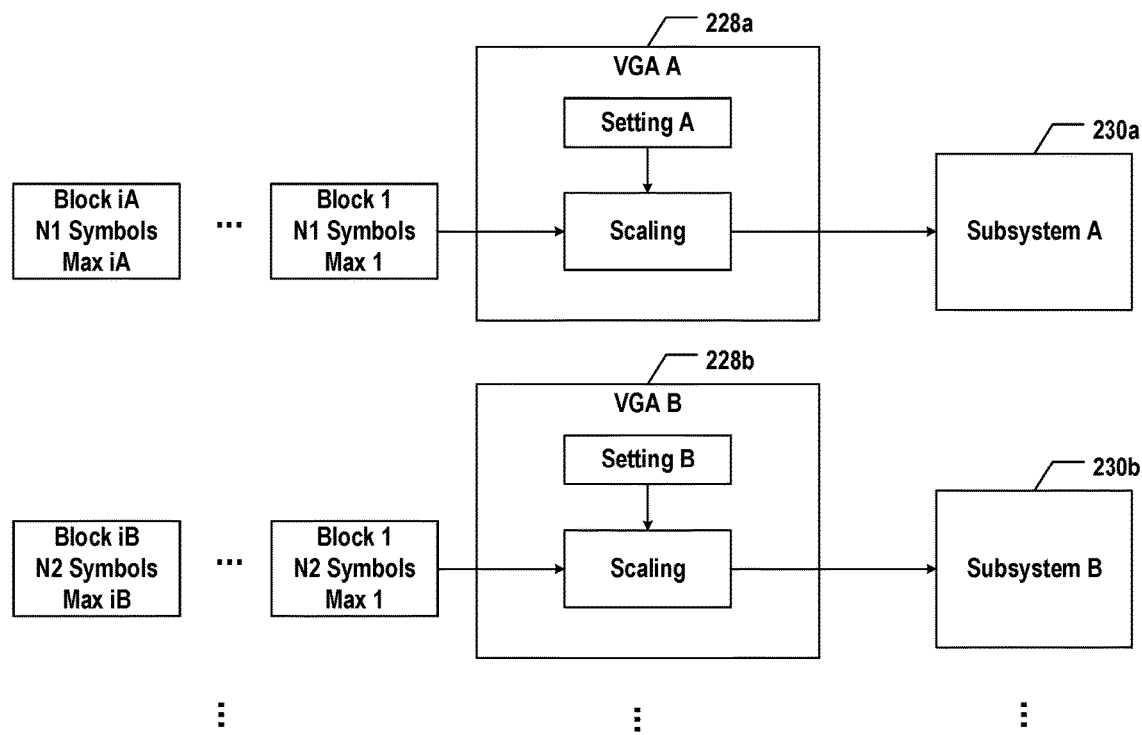

As shown in FIG. 7B, first VGA module 228a may be configured to scale an amplitude of each symbol based on the settings A and the symbol parameter at the symbol block level. Setting A may include the symbol accuracy of channel estimator 230a, for example, the output bit number of first VGA module 228a, e.g., 8-bits. Second VGA module 228b may be configured to scale the amplitude of each symbol based on settings B and the symbol parameter at the symbol block level. The setting B may include the symbol accuracy of searcher 230b, for example, the output bit number of second VGA module 228b, e.g., 12-bits. At first VGA module 228a, the amplitude of the symbol having the largest signal level in each symbol block may be scaled such that the bit number of its I/Q magnitude number (the largest I/Q magnitude number in the symbol block) matches the output bit number of first VGA module 228a, and the amplitudes of the rest symbols in the same symbol group may be scaled up or scaled down accordingly. In contrast, at second VGA module 228b, the amplitude of the symbol having the largest signal level in each symbol block may be scaled such that the bit number of its I/Q magnitude number (the largest I/Q magnitude number in the symbol block) matches the output bit number of second VGA module 228b, and the amplitudes of the rest symbols in the same symbol group may be scaled up or scaled down accordingly. As a result, even with the same symbol parameter, e.g., the same maximum signal level and the same block size, first and second VGA modules 228a and 228b may still scale the same symbol differently due to the different settings thereof, e.g., different symbol accuracies of channel estimator 230a and searcher 230b. It is understood that as shown in FIG. 7B, each VGA module 228a or 228b may customize its gain adjustments based on its own settings as well as dynamically adjust the gains at the symbol block level.

It is understood that each module or any other components of apparatus 200 disclosed herein may be implemented as a software module, such as instruction stored in memory 1004 and running on processor 1002 (e.g., DSPs), and/or a hardware module, such as integrated circuits (ICs) (e.g., ASICs, FPGAs, PLDs, etc.), which performs the respective functions disclosed herein.

Figure 8:
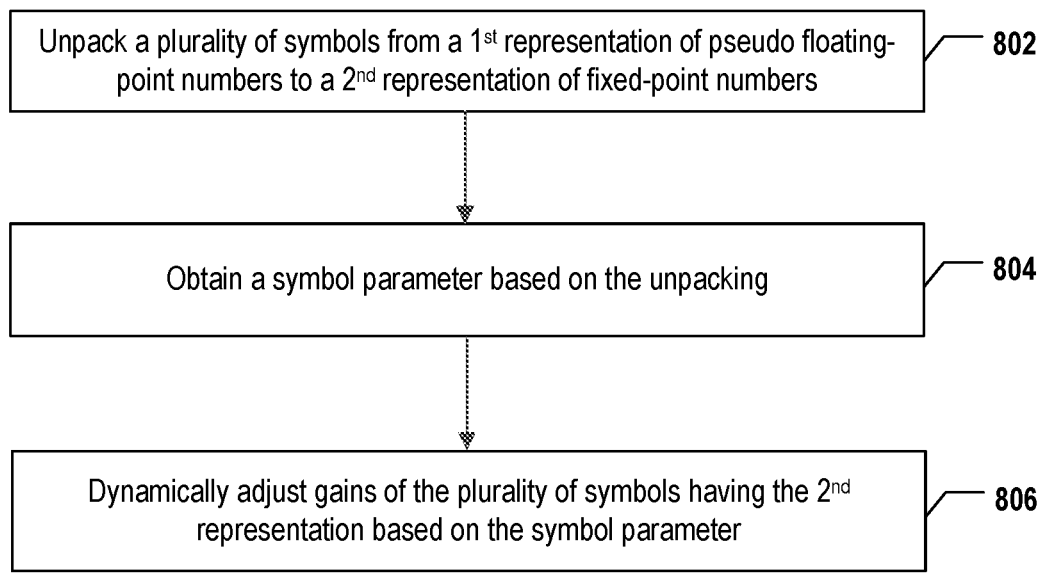
FIG. 8 illustrates a flow chart of an exemplary method for DVGA implementation based on symbol parameters, according to some embodiments of the present disclosure.

FIG. 8 illustrates a flow chart of an exemplary method 800 for DVGA implementation based on symbol parameters, according to some embodiments of the present disclosure. Examples of the apparatus that can perform operations of method 800 include, for example, apparatus 200 depicted in FIG. 2 or any other suitable apparatus disclosed herein. It is understood that the operations shown in method 800 are not exhaustive and that other operations can be performed as well before, after, or between any of the illustrated operations. Further, some of the operations may be performed simultaneously, or in a different order than shown in FIG. 8.

Referring to FIG. 8, method 800 starts at operation 802, in which a plurality of symbols are unpacked from a first representation of pseudo floating-point numbers to a second representation of fixed-point numbers. As shown in FIG. 2, unpacking module 220 of baseband chip 204 may receive a stream of symbols in the first representation of pseudo floating-point numbers from RF chip 202 and unpack the symbols to the second representation of fixed-point numbers. Method 800 proceeds to operation 804, as illustrated in FIG. 8, in which a symbol parameter is obtained based on the unpacking. As shown in FIG. 2, symbol recording module 224 of baseband chip 204 may obtain the symbol parameter based on the unpacking. The symbol parameter may be indicative of the largest signal level of the symbols. Method 800 proceeds to operation 806, as illustrated in FIG. 8, in which gains of the plurality of symbols having the second representation are dynamically adjusted based on the symbol parameter. The details of operations 802, 804, and 806 are described below with respect to FIG. 9.

Figure 9:
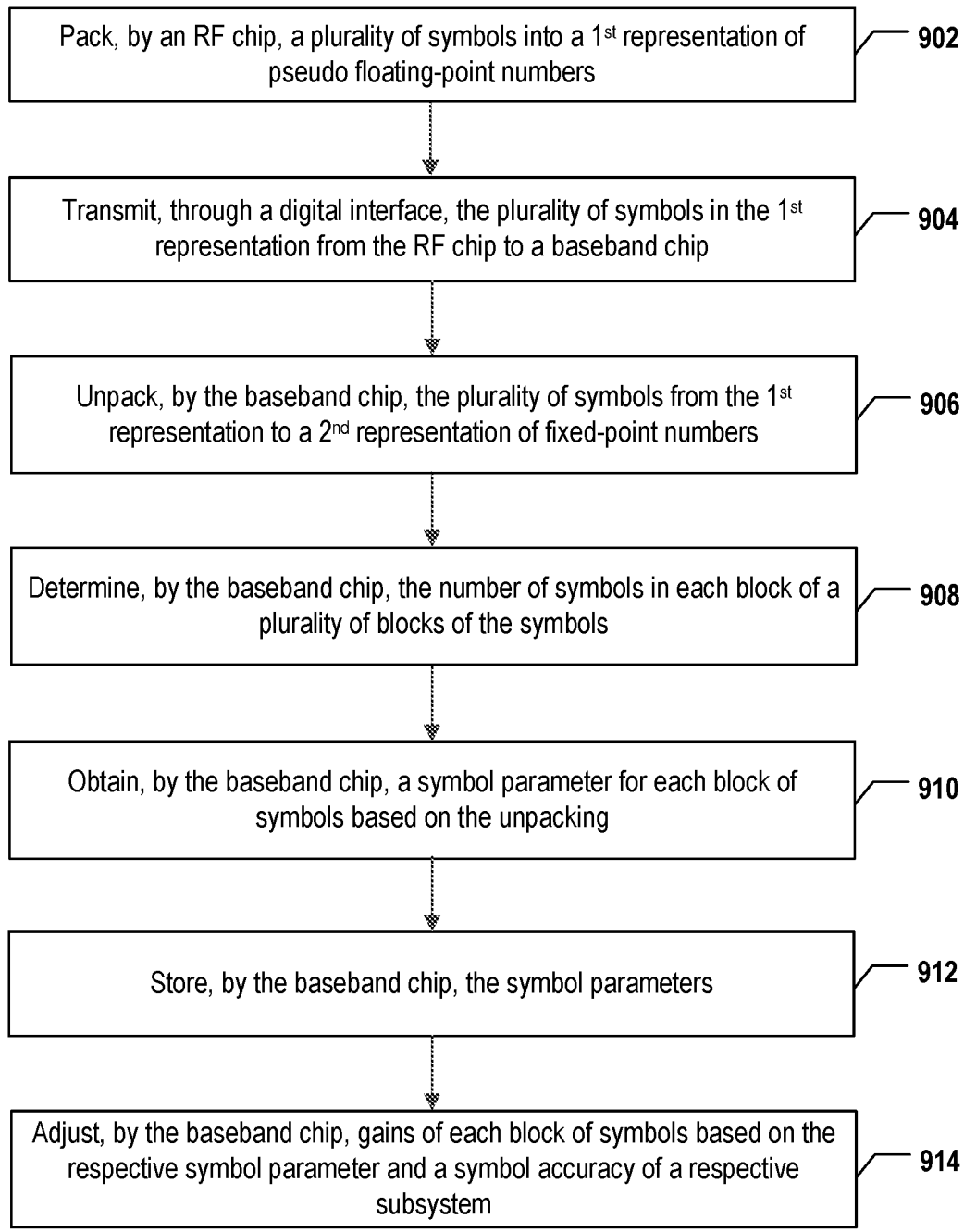
FIG. 9 illustrates a flow chart of another exemplary method for DVGA implementation based on symbol parameters, according to some embodiments of the present disclosure.

FIG. 9 illustrates a flow chart of another exemplary method 900 for DVGA implementation based on symbol parameters, according to some embodiments of the present disclosure. Examples of the apparatus that can perform operations of method 900 include, for example, RF chip 202 and baseband chip 204 depicted in FIG. 2 or any other suitable apparatus disclosed herein. It is understood that the operations shown in method 900 are not exhaustive and that other operations can be performed as well before, after, or between any of the illustrated operations. Further, some of the operations may be performed simultaneously, or in a different order than shown in FIG. 9.

Referring to FIG. 9, method 900 starts at operation 902, in which a plurality of symbols are packed, by an RF chip, into a first representation of pseudo floating-point numbers. As shown in FIG. 2, packing module 218 of RF chip 202 may pack symbols from fixed-point numbers into pseudo floating-point numbers. Method 900 proceeds to operation 904, as illustrated in FIG. 9, in which the symbols in the first representation are transmitted by a digital interface from the RF chip to a baseband chip. As shown in FIG. 2, digital interface 206 may transmit the symbols in pseudo floating-point numbers from RF chip 202 to baseband chip 204.

Method 900 proceeds to operation 906, as illustrated in FIG. 9, in which the symbols are unpacked, by the baseband chip, from the first representation to a second representation of fixed-point numbers. As shown in FIG. 2, unpacking module 220 of baseband chip 204 may unpack the symbols back to the fixed-point numbers.

Method 900 proceeds to operation 908, as illustrated in FIG. 9, in which the number of symbols in each block of symbols are determined by the baseband chip. As shown in FIG. 5, block size logic 502 of baseband chip 204 may determine the block sizes and store them into block size register 504. The block size may be a preset number that is the same for each symbol block or may be determined based on a characteristic of the respective symbol block.

Method 900 proceeds to operation 910, as illustrated in FIG. 9, in which a symbol parameter is obtained, by the baseband chip, for each block of symbols based on the unpacking. As shown in FIGS. 2 and 5, symbol recording module 224 of baseband chip 204 may record a respective symbol parameter for each symbol block based on the unpacking. The symbol parameter may be indicative of the largest signal level of the symbols in the symbol block. Method 900 proceeds to operation 912, as illustrated in FIG. 9, in which the symbol parameters are stored by the baseband chip. As shown in FIGS. 2 and 5, symbol recording module 224 of baseband chip 204 may store the symbol parameters into register 226.

Method 900 proceeds to operation 914, as illustrated in FIG. 9, in which gains of each block of symbols are adjusted, by the baseband chip, based on the respective symbol parameter and a symbol accuracy of a respective subsystem. An amplitude of each symbol may be scaled based on the symbol accuracy and the symbol parameter. As shown in FIGS. 2, 7A, and 7B, each VGA module 228 of baseband chip 204 may adjust the gains of each symbol block based on the symbol accuracy of respective subsystem 230 and the symbol parameter of the respective symbol block. For example, each VGA module 228 may scale the amplitude of each symbol in a symbol block based on the respective symbol accuracy and the maximum signal level of the symbol block.

In various aspects of the present disclosure, the functions described herein may be implemented in hardware, software, firmware, or any combination thereof. If implemented in software, the functions may be stored on or encoded as instructions or code on a non-transitory computer-readable medium. Computer-readable media includes computer storage media. Storage media may be any available media that can be accessed by a computing device, such as node 1000 in FIG. 10. By way of example, and not limitation, such computer-readable media can include RAM, ROM, EEPROM, CD-ROM or other optical disk storage, HDD, such as magnetic disk storage or other magnetic storage devices, Flash drive, SSD, or any other medium that can be used to carry or store desired program code in the form of instructions or data structures and that can be accessed by a processing system, such as a mobile device or a computer. Disk and disc, as used herein, includes CD, laser disc, optical disc, DVD, and floppy disk where disks usually reproduce data magnetically, while discs reproduce data optically with lasers. Combinations of the above should also be included within the scope of computer-readable media.

According to one aspect of the present disclosure, a baseband chip includes an unpacking module, a symbol recording module operatively coupled to the unpacking module, and a first VGA module operatively coupled to the symbol recording module. The unpacking module is configured to unpack a plurality of symbols from a first representation of pseudo floating-point numbers to a second representation of fixed-point numbers. The symbol recording module is configured to obtain a symbol parameter based on the unpacking. The first VGA module is configured to dynamically adjust gains of the plurality of symbols having the second representation based on the symbol parameter.

In some embodiments, the symbol parameter is indicative of a largest signal level of the plurality of symbols.

In some embodiments, the symbol parameter includes at least one of a largest magnitude number of real parts and imaginary parts of the fixed-point numbers, or a largest exponential number of the pseudo floating-point numbers.

In some embodiments, the baseband chip further includes a first register operatively coupled to the symbol recording module and configured to store the symbol parameter.

In some embodiments, the plurality of symbols include a plurality of blocks of symbols, the symbol recording module is configured to obtain a respective symbol parameter for each block of the plurality of blocks of symbols, and the first VGA module is configured to adjust gains of each block of symbols based on the respective symbol parameter.

In some embodiments, the symbol parameter includes a number of symbols in each block of symbols. In some embodiments, the baseband chip further includes a second register operatively coupled to the symbol recording module and configured to store the number of symbols in each block of symbols, and logic configured to determine the number of symbols based on a characteristic of the respective block of symbols.

In some embodiments, the baseband chip further includes a first subsystem operatively coupled to the first VGA module and is associated with a first symbol accuracy. In some embodiments, the first VGA module is configured to adjust the gains of the plurality of symbols based on the first symbol accuracy and the symbol parameter.

In some embodiments, to adjust the gains of the plurality of symbols, the first VGA module is configured to scale an amplitude of each of the plurality of symbols based on the first symbol accuracy and the symbol parameter.

In some embodiments, the first symbol accuracy includes a bit number of an output of the first VGA module.

In some embodiments, the baseband chip further includes a second VGA module operatively coupled to the symbol recording module, and a second subsystem operatively coupled to the second VGA module and is associated with a second symbol accuracy. In some embodiments, the second VGA module is configured to adjust the gains of the plurality of symbols based on the second symbol accuracy and the symbol parameter.

In some embodiments, the first and second subsystems include a channel estimator and a searcher.

In some embodiments, the unpacking module is further configured to receive the plurality of symbols having the first representation from an RF chip.

According to another aspect of the present disclosure, an apparatus for wireless communication includes a radio frequency (RF) chip and a baseband chip. The RF chip includes an RF front-end, and a packing module operatively coupled to the RF front-end and configured to pack a plurality of symbols into a first representation of pseudo floating-point numbers. The baseband chip includes an unpacking module, a symbol recording module operatively coupled to the unpacking module, and a VGA module operatively coupled to the symbol recording module. The unpacking module is configured to unpack the plurality of symbols from the first representation to a second representation of fixed-point numbers. The symbol recording module is configured to obtain a symbol parameter based on the unpacking. The VGA module is configured to dynamically adjust gains of the plurality of symbols having the second representation based on the symbol parameter.

In some embodiments, the apparatus further includes a digital interface between the RF chip and the baseband chip and configured to transmit the plurality of symbols in the first representation from the RF chip to the baseband chip.

According to still another aspect of the present disclosure, a method implemented by a baseband chip for wireless communication is disclosed. A plurality of symbols are unpacked from a first representation of pseudo floating-point numbers to a second representation of fixed-point numbers. A symbol parameter is obtained based on the unpacking. Gains of the plurality of symbols having the second representation are dynamically adjusted based on the symbol parameter.

In some embodiments, the symbol parameter is indicative of a largest signal level of the plurality of symbols.

In some embodiments, the plurality of symbols include a plurality of blocks of symbols. In some embodiments, to obtain the symbol parameter, a respective symbol parameter is obtained for each block of the plurality of blocks of symbols. In some embodiments, to dynamically adjust the gains, gains of each block of symbols are adjusted based on the respective symbol parameter.

In some embodiments, the symbol parameter includes a number of symbols in each block of symbols. In some embodiments, the number of symbols is determined based on a characteristic of the respective block of symbols, and the number of symbols in each block of symbols is stored.

In some embodiments, to dynamically adjust the gains, an amplitude of each of the plurality of symbols is scaled based on a symbol accuracy and the symbol parameter.

In some embodiments, the plurality of symbols having the first representation are received from an RF chip.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

Various functional blocks, modules, and steps are disclosed above. The particular arrangements provided are illustrative and without limitation. Accordingly, the functional blocks, modules, and steps may be re-ordered or combined in different ways than in the examples provided above. Likewise, certain embodiments include only a subset of the functional blocks, modules, and steps, and any such subset is permitted.

The breadth and scope of the present disclosure should not be limited by any of the above-described exemplary embodiments, but should be defined only in accordance with the following claims and their equivalents.

What is claimed is:

1. A baseband chip, comprising:
    an unpacking module configured to unpack a plurality of symbols from a first representation of pseudo floating-point numbers to a second representation of fixed-point numbers;
    a symbol recording module operatively coupled to the unpacking module and configured to obtain a symbol parameter based on the unpacking; and
    a first variable gain adjusting (VGA) module operatively coupled to the symbol recording module and configured to dynamically adjust gains of the plurality of symbols having the second representation based on the symbol parameter,
    wherein the symbol parameter is indicative of a largest signal level of the plurality of symbols.

2. The baseband chip of claim 1, wherein the symbol parameter comprises at least one of:
    a largest magnitude number of real parts and imaginary parts of the fixed-point numbers; or
    a largest exponential number of the pseudo floating-point numbers.

3. The baseband chip of claim 1, further comprising a first register operatively coupled to the symbol recording module and configured to store the symbol parameter.

4. The baseband chip of claim 1, wherein
    the plurality of symbols comprise a plurality of blocks of symbols;
    the symbol recording module is configured to obtain a respective symbol parameter for each block of the plurality of blocks of symbols; and
    the first VGA module is configured to adjust gains of each block of symbols based on the respective symbol parameter.

5. The baseband chip of claim 4, wherein
    the symbol parameter comprises a number of symbols in each block of symbols; and
    the baseband chip further comprises a second register operatively coupled to the symbol recording module and configured to store the number of symbols in each block of symbols, and logic configured to determine the number of symbols based on a characteristic of the respective block of symbols.

6. The baseband chip of claim 1, further comprising a first subsystem operatively coupled to the first VGA module and is associated with a first symbol accuracy, wherein the first VGA module is configured to adjust the gains of the plurality of symbols based on the first symbol accuracy and the symbol parameter.

7. The baseband chip of claim 6, wherein to adjust the gains of the plurality of symbols, the first VGA module is configured to scale an amplitude of each of the plurality of symbols based on the first symbol accuracy and the symbol parameter.

8. The baseband chip of claim 6, wherein the first symbol accuracy comprises a bit number of an output of the first VGA module.

9. The baseband chip of claim 6, further comprising a second VGA module operatively coupled to the symbol recording module, and a second subsystem operatively coupled to the second VGA module and is associated with a second symbol accuracy,
    wherein the second VGA module is configured to adjust the gains of the plurality of symbols based on the second symbol accuracy and the symbol parameter.

10. The baseband chip of claim 9, wherein the first and second subsystems comprise a channel estimator and a searcher.

11. The baseband chip of claim 1, wherein the unpacking module is further configured to receive the plurality of symbols having the first representation from a radio frequency (RF) chip.

12. An apparatus for wireless communication, comprising:
    a radio frequency (RF) chip, comprising:
        an RF front-end; and
        a packing module operatively coupled to the RF front-end and configured to pack a plurality of symbols into a first representation of pseudo floating-point numbers; and
    a baseband chip comprising:
        an unpacking module configured to unpack the plurality of symbols from the first representation to a second representation of fixed-point numbers;
        a symbol recording module operatively coupled to the unpacking module and configured to obtain a symbol parameter based on the unpacking; and
        a variable gain adjusting (VGA) module operatively coupled to the symbol recording module and configured to dynamically adjust gains of the plurality of symbols having the second representation based on the symbol parameter,
    wherein the symbol parameter is indicative of a largest signal level of the plurality of symbols.

13. The apparatus of claim 12, further comprising a digital interface between the RF chip and the baseband chip and configured to transmit the plurality of symbols in the first representation from the RF chip to the baseband chip.

14. A method implemented by a baseband chip for wireless communication, the method comprising:
    unpacking a plurality of symbols from a first representation of pseudo floating-point numbers to a second representation of fixed-point numbers;
    obtaining a symbol parameter based on the unpacking; and dynamically adjusting gains of the plurality of symbols having the second representation based on the symbol parameter, wherein the symbol parameter is indicative of a largest signal level of the plurality of symbols.

15. The method of claim 14, wherein the plurality of symbols comprise a plurality of blocks of symbols;

obtaining the symbol parameter comprises obtaining a respective symbol parameter for each block of the plurality of blocks of symbols; and dynamically adjusting the gains comprises adjusting gains of each block of symbols based on the respective symbol parameter.

16. The method of claim 15, wherein the symbol parameter comprises a number of symbols in each block of symbols; and the method further comprises:

determining the number of symbols based on a characteristic of the respective block of symbols; and storing the number of symbols in each block of symbols.

17. The method of claim 14, wherein dynamically adjusting the gains comprises scaling an amplitude of each of the plurality of symbols based on a symbol accuracy and the symbol parameter.

18. The method of claim 14, further comprising receiving the plurality of symbols having the first representation from a radio frequency (RF) chip.

* * * * *